(12) United States Patent
Hung et al.

(10) Patent No.: US 10,263,148 B1
(45) Date of Patent: Apr. 16, 2019

(54) LIGHT EMITTING DIODE STRUCTURE

(71) Applicant: ADVANCED OPTOELECTRONIC TECHNOLOGY, INC., Hsinchu Hsien (TW)

(72) Inventors: Tzu-Chien Hung, Hsinchu (TW); Chien-Chung Peng, Hsinchu (TW); Chien-Shiang Huang, Hsinchu (TW); Chia-Hui Shen, Hsinchu (TW); Po-Min Tu, Hsinchu (TW)

(73) Assignee: ADVANCED OPTOELECTRONIC TECHNOLOGY, INC, Hsinchu Hsien (TW)

( * ) Notice: Subject to any disclaimer, the term of this patent is extended or adjusted under 35 U.S.C. 154(b) by 0 days.

(21) Appl. No.: 15/785,507

(22) Filed: Oct. 17, 2017

(30) Foreign Application Priority Data

Sep. 30, 2017 (CN) .......................... 2017 1 0915276

(51) Int. Cl.
| | |
|---|---|
| *H01L 33/20* | (2010.01) |
| *H01L 33/06* | (2010.01) |
| *H01L 33/62* | (2010.01) |
| *H01L 33/38* | (2010.01) |
| *H01L 33/46* | (2010.01) |
| *H01L 33/32* | (2010.01) |

(52) U.S. Cl.
CPC .............. *H01L 33/20* (2013.01); *H01L 33/06* (2013.01); *H01L 33/32* (2013.01); *H01L 33/38* (2013.01); *H01L 33/46* (2013.01); *H01L 33/62* (2013.01)

(58) Field of Classification Search
CPC ......... H01L 33/20; H01L 33/32; H01L 33/46; H01L 33/06; H01L 33/62; H01L 33/38
See application file for complete search history.

(56) References Cited

U.S. PATENT DOCUMENTS

| | | | | |
|---|---|---|---|---|
| 2004/0090179 | A1* | 5/2004 | Lin | ..................... H01L 33/0079 313/506 |
| 2007/0058059 | A1* | 3/2007 | Suehiro | ................. H01L 33/486 348/294 |
| 2007/0090377 | A1* | 4/2007 | Lin | ....................... H01L 27/153 257/94 |
| 2008/0230791 | A1 | 9/2008 | Lin et al. | |
| 2011/0294242 | A1* | 12/2011 | Lu | .......................... H01L 33/20 438/27 |
| 2012/0299038 | A1 | 11/2012 | Hwang et al. | |

* cited by examiner

*Primary Examiner* — Syed I Gheyas
(74) *Attorney, Agent, or Firm* — ScienBiziP, P.C.

(57) ABSTRACT

A light emitting diode structure includes a first electrode, a second electrode, and an epitaxial structure. The epitaxial structure is divided into a base area and a structural supporting area. The base area includes a bottom portion and a top portion. The bottom portion is wider than the top portion. The top portion protrudes from a surface of the bottom portion along a single direction. The structural supporting area protrudes from the surface of the bottom portion beside the top portion along the same single direction. A top of the structural supporting area is aligned with a top of the top portion. The first electrode is arranged on the top of the top portion. The second electrode is at least arranged on the top of the structural supporting area. The second electrode arranged on the structural supporting area is aligned with the first electrode.

11 Claims, 6 Drawing Sheets

LIGHT EMITTING DIODE STRUCTURE

FIELD

The subject matter herein generally relates to semiconductor structures, and particularly relates to a light emitting diode (LED) structure.

BACKGROUND

An LED includes a light transmission substrate, an N-type semiconductor layer, an active layer, a P-type semiconductor layer, a P-type electrode and an N-type electrode. The active layer protrudes from a center area of the N-type semiconductor layer. The P-type semiconductor layer is arranged on the active layer. The P-type electrode is arranged on a surface of the P-type semiconductor layer, and the N-type electrode is arranged on a surface of the N-type semiconductor layer beside the active layer. The whole N-type electrode is usually attached to the N-type semiconductor layer.

Since the P-type electrode and the N-type electrode are separately formed by sputtering or vapor deposition, a difference between the heights of P-type electrode and the N-type electrode may occur, which causes a bad contact when the P-type electrode and the N-type electrode are connected to external electrodes via metal bonding. Improvement in the art is preferred.

BRIEF DESCRIPTION OF THE DRAWINGS

Implementations of the present technology will now be described, by way of example only, with reference to the attached figures.

DETAILED DESCRIPTION

Figure 1:
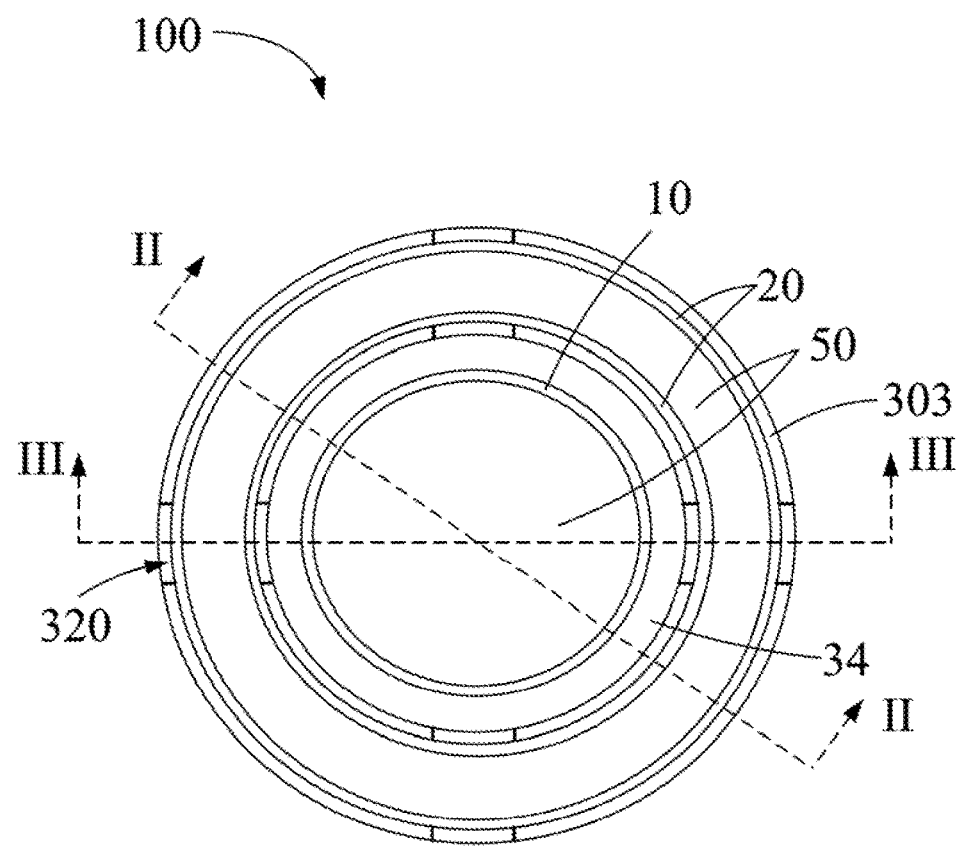
FIG. 1 is a plan diagram of an exemplary embodiment of an LED structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
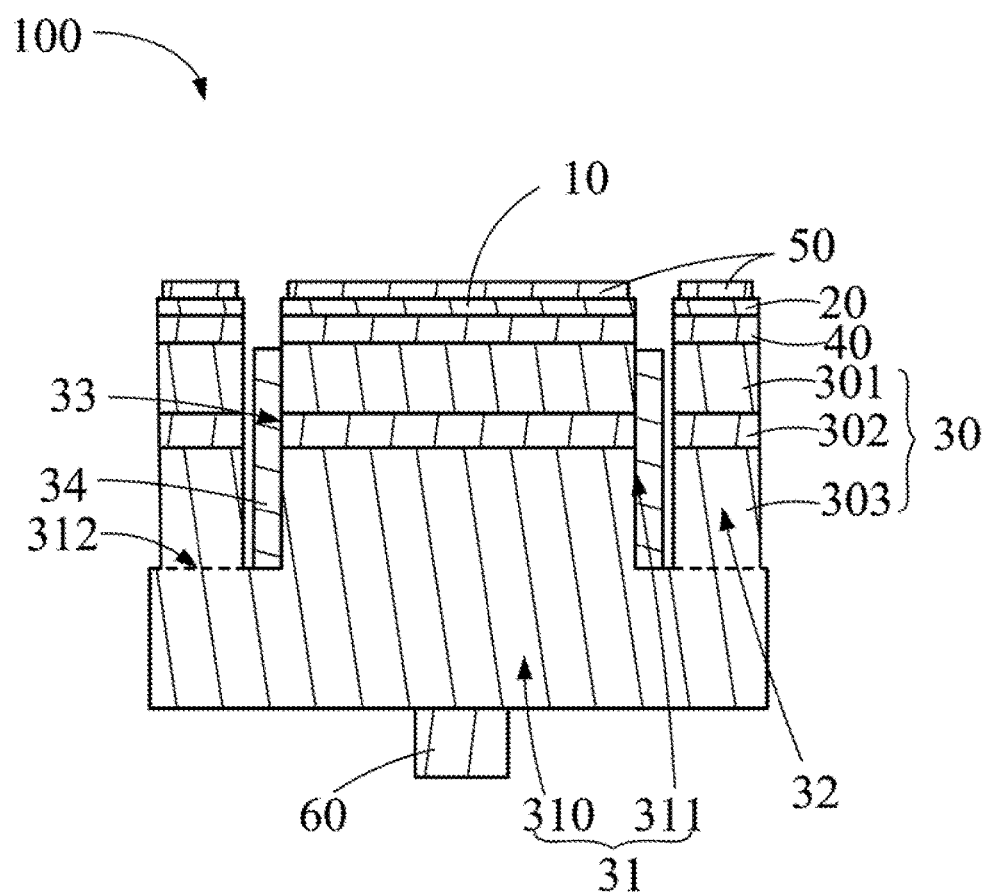
FIG. 2 is a cross-sectional view taken along line II-II of FIG. 1.
Figure 3:
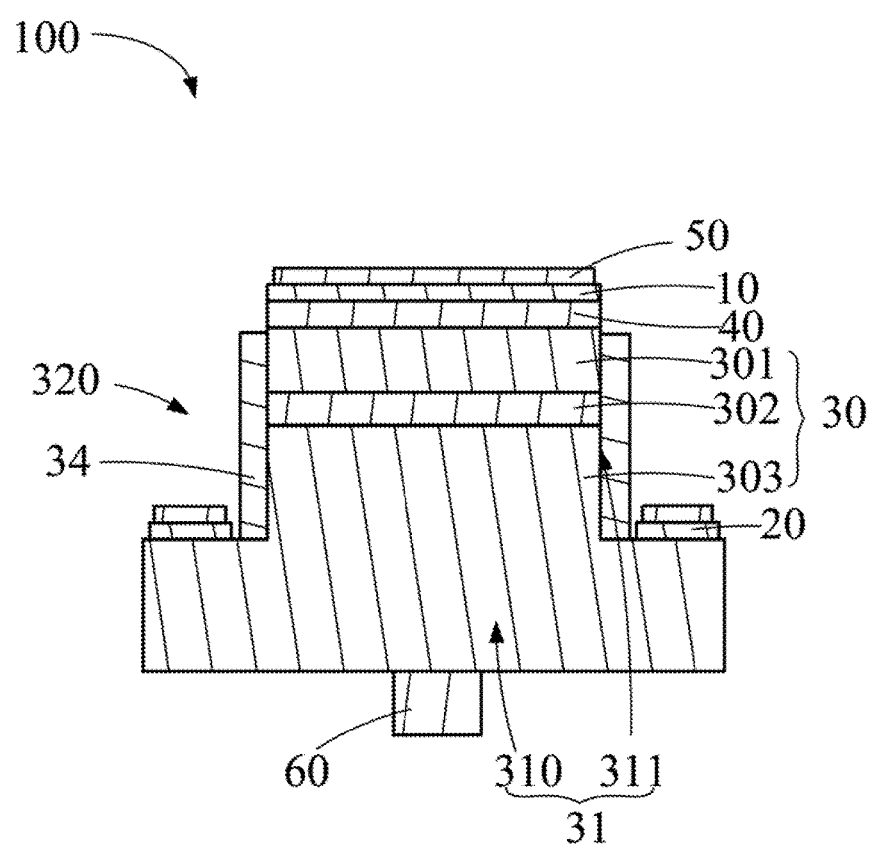
FIG. 3 is a cross-sectional view taken along line III-III of FIG. 1.

FIGS. 1 to 3 illustrate a first exemplary embodiment of an LED structure 100 comprising a first electrode 10, a second electrode 20, and an epitaxial structure 30. The first electrode 10 and the second electrode 20 are arranged on and electrically connected to the epitaxial structure 30. The LED structure 100 is substantially circular. In at least one exemplary embodiment, the first electrode 10 and the second electrode 20 are arranged on the epitaxial structure 30 through an electrode film 40, thereby being electrically connected to the epitaxial structure 30 through the electrode film 40. The electrode film 40 can be made of Indium Tin Oxide (ITO). In another exemplary embodiment, the first electrode 10 and the second electrode 20 are directly attached to the epitaxial structure 30.

The epitaxial structure 30 is divided into a base area 31 and a structural supporting area 32 which is annular and surrounds the base area 31. The base area 31 is substantially T-shaped along a cross-section passing through a center axis of the LED structure 100. That is, the base area 31 comprises a bottom portion 310 and a top portion 311. The bottom portion 310 is wider than the top portion 311. The top portion 311 protrudes from a center area of the bottom portion 310 along a single direction, thereby forming a connecting surface 312 at the bottom portion 310 surrounding the top portion 311. The structural supporting area 32 is annular and protrudes from the connecting surface 312 along the same single direction, thereby causing the structural supporting area 32 to surround the top portion 311. A top of the structural supporting area 32 is aligned (e.g., coplanar) with a top of the top portion 311. The structural supporting area 32 defines at least one slot 320 parallel to the center axis of the LED structure 100. The bottom portion 310 seals an end of each slot 320. That is, the bottom portion 310 forms a bottom of the slot 320.

The first electrode 10 is arranged on the top of the top portion 311. The second electrode 20 is arranged at the bottom of the slot 320 and the top of the structural supporting area 32. The second electrode 20 positioned at the top of the structural supporting area 32 forms an electrode contacting region, which is aligned with the first electrode 10. The second electrode 20 arranged at the bottom of the slot 320 (no structural supporting area 32 below) is attached to the bottom portion 310 and forms a current injection region. The electrode contacting region and the current injection region of the second electrode 20 have different heights. The first electrode 10 and the second electrode 20 are electrically connected to external electrodes (not shown) through metal bonding, and the epitaxial structure 30 is driven to emit light.

In at least one exemplary embodiment, the structural supporting area 32 defines four slots 320, which divides the structural supporting area 32 into four portions of equal size. That is, an imaginary line connecting each two opposite slots 320 intersects with the center axis of the LED structure 100. The epitaxial structure 30 has a thickness of about 2 μm to about 6 μm. The difference between heights of the electrode contacting region and the current injection region (equal to the depth of each slot 320) is about 0.2 μm to about 2 μm. In another exemplary embodiment, the imaginary line connecting each two opposite slots 320 does not intersect with the center axis of the LED structure 100.

The structural supporting area 32 is spaced apart from the top portion 311, thereby forming an annular groove 33 between the structural supporting area 32 and the top portion 311. The annular groove 33 communicates with the slot 320. The depth of the annular groove 33 can be equal to the depth of the slot 320. An insulating layer 34 is received in the annular groove 33 and surrounds the periphery of the top portion 311, thereby obtaining electrical insulation between the first electrode 10 and the second electrode 20. The insulating layer 34 can be made of a material selected from silica ($SiO_2$), silicon nitride ($SiN_x$), and epoxy resin (for example, SU-8 resin).

In at least one exemplary embodiment, a solder bump 50 is arranged on the top of the first electrode 10 and on the top of the second electrode 20.

The epitaxial structure 30 comprises a first semiconductor layer 301, an active layer 302, and a second semiconductor layer 303. The second semiconductor layer 303 is positioned at the bottom portion 310 and extends to the top portion 311 and the structural supporting area 32. The first semiconductor layer 301 and the active layer 302 are positioned at the top portion 311 and the structural supporting area 32. The active layer 302 positioned at the top portion 311 is aligned with the active layer 302 positioned at the structural supporting area 32. The first semiconductor layer 301 positioned at the top portion 311 is aligned with the first semiconductor layer 301 positioned at the structural supporting area 32. The first electrode 10 is arranged on the top of the first semiconductor layer 301 positioned at the top portion 311. The second electrode 20 is arranged at the bottom of the slot 320 (that is, attached to the second semiconductor layer 303) and on the top of the first semiconductor layer 301 positioned at the structural supporting area 32. When in use, the active layer 302, which is surrounded by the insulating layer 34, emits light. The light is emitted out of a surface of the second semiconductor layer 303 facing away from the active layer 302. Furthermore, the light travelling towards the periphery of the epitaxial structure 30 is reflected by the insulating layer 34 and then is emitted out from the surface of the second semiconductor layer 303 facing away from the active layer 302.

In at least one exemplary embodiment, the first electrode 10 is a P-type electrode. The second electrode 20 is an N-type electrode. The first semiconductor layer 301 is a P-GaN (P-type Gallium Nitride) layer. The active layer 302 is a multiple quantum wells (MQWs) layer. The second semiconductor layer 303 is an N-GaN (N-type Gallium Nitride) layer. The first electrode 10 and the second electrode 20 can be made of a metal selected from germanium (Ge), nickel (Ni), chromium (Cr), titanium (Ti), tungsten (W), gold (Au), and any combination thereof.

The LED structure 100 can further comprise a supporting portion 60. The supporting portion 60 is arranged on the surface of the second semiconductor layer 303 facing away from the active layer 302. The supporting portion 60 can be made of plastic material, photo-resist material, $SiO_2$, $SiN_x$, or quantum dots (QDs).

The LED structure 100 can further comprise a protection layer (not shown). The protection layer surrounds the periphery of the epitaxial structure 30 to protect the epitaxial structure 30. The protection layer can be a transparent and thermally conductive material.

Figure 4:
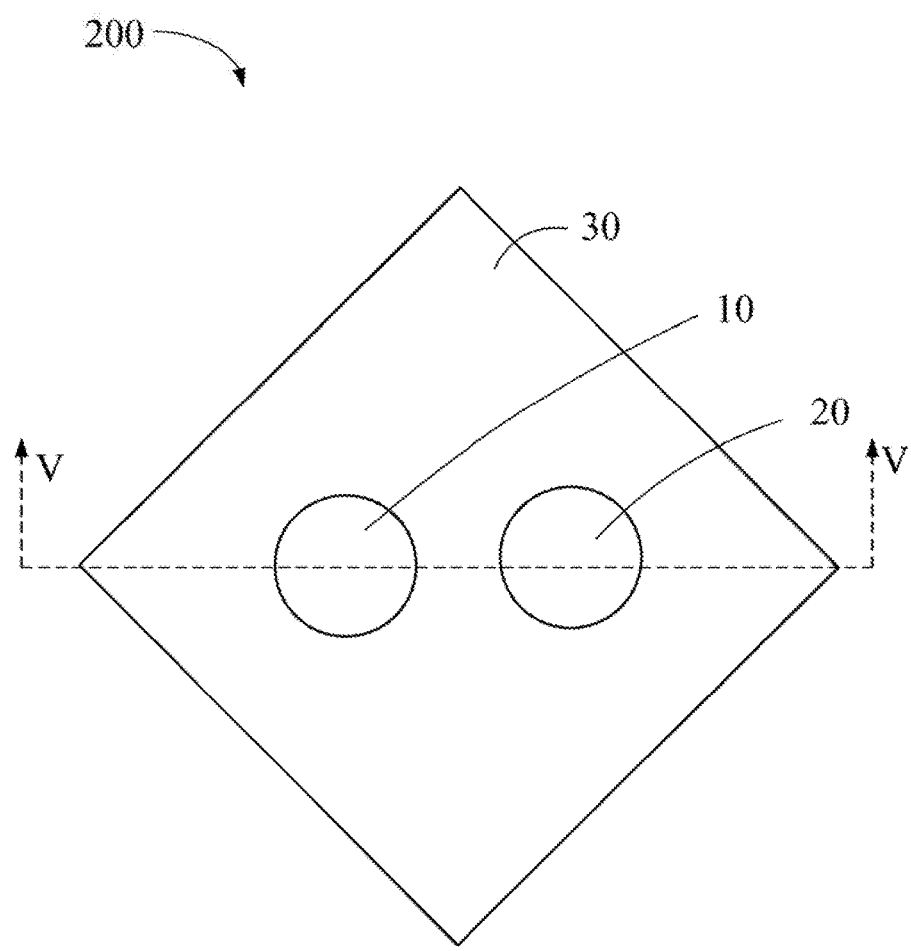
FIG. 4 is a plan diagram of another exemplary embodiment of an LED structure.
Figure 5:
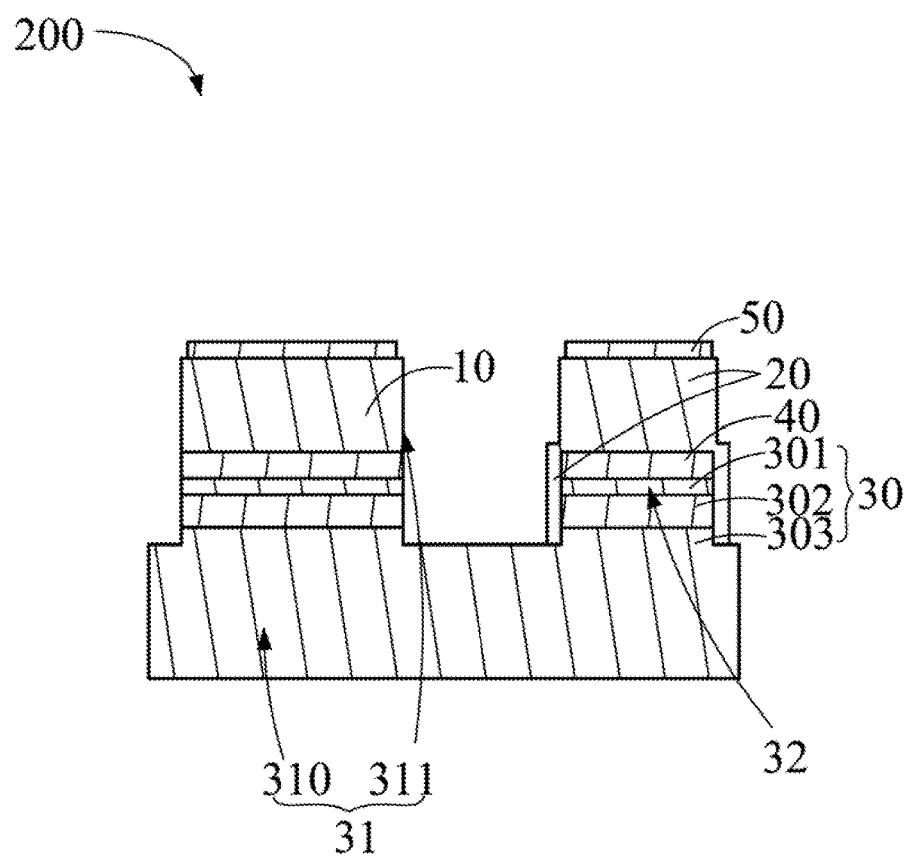
FIG. 5 is a cross-sectional view taken along line V-V of FIG. 4.

FIGS. 4 and 5 illustrate a second exemplary embodiment of an LED structure 200. Different from the LED structure 100, the LED structure 200 is substantially square. The structural supporting area 32 does not surround the top portion 311, but is positioned at a side of the top portion 311. The top of the structural supporting area 32 is aligned with the top of the top portion 311. The second electrode 20 is arranged on the top and at the periphery of the structural supporting area 32. The second electrode 20 arranged at the top of the structural supporting area 32 forms the electrode contacting region. The second electrode 20 arranged at the periphery of the structural supporting area 32 surrounds the first semiconductor layer 301, the active layer 302, and the second semiconductor layer 303, and is attached to the bottom portion 310 and forms the current injection region.

Figure 6:
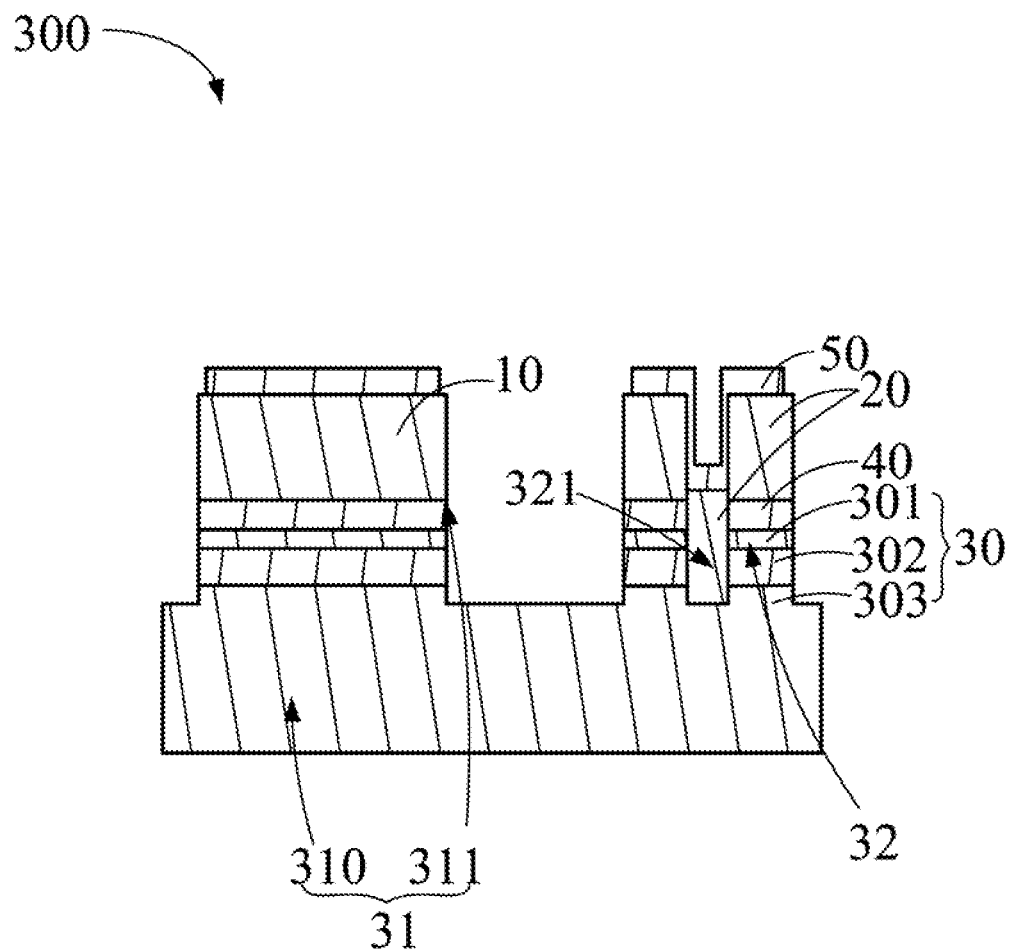
FIG. 6 is a cross-sectional view of yet another exemplary embodiment of an LED structure.

FIG. 6 illustrates a third exemplary embodiment of an LED structure 300. Different from the LED structure 200, the structural supporting area 32 of the LED structure 300 defines a recess 321. The recess 321 extends from the first semiconductor layer 301 to the active layer 302 and the second semiconductor layer 303. The second electrode 20 is arranged on the top of the structural supporting area 32 beside the recess 321 and fills in the recess 321. The second electrode 20 arranged at the top of the structural supporting area 32 forms the electrode contacting region. The second electrode 20 filling in the recess 321 is attached to the bottom portion 310 and forms the current injection region.

With the above configuration, the top of the structural supporting area 32 is aligned with the top of the top portion 311. Thus, when the time period for sputtering the first electrode 10 is controlled to be equal to the time period for sputtering the second electrode 20, the first electrode 10 arranged on the top portion 311 can be aligned with the second electrode 20 arranged on the structural supporting area 32. That is, the structural supporting area 32 can block up the periphery of the second semiconductor layer 303 to avoid a height difference emerging between the first electrode 10 and the second electrode 20. Thus, bad or less than optimal contact during metal bonding can be avoided. Furthermore, only a portion of the second electrode 20 is attached to the bottom portion 310 to form the current injection region. The current injection region and the electrode contacting region have different heights. Finally, since the periphery of the epitaxial structure 30 is thickened by the structural supporting area 32, the LED structures 100-300 enjoy improved mechanical strength.

Even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A light emitting diode structure comprising:
   a first electrode;
   a second electrode; and
   an epitaxial structure, the epitaxial structure divided into a base area and a structural supporting area, the base area comprising a bottom portion and a top portion, the bottom portion being wider than the top portion, the top portion protruding from a surface of the bottom portion along a single direction, the structural supporting area protruding from the surface of the bottom portion beside the top portion along the same single direction, the light emitting diode structure being substantially circular, the structural supporting area being annular and surrounding the top portion, a top of the structural supporting area aligned with a top of the top portion, the structural supporting area defining at least one slot parallel to a center axis of the light emitting diode structure, the bottom portion forming a bottom of each slot, the first electrode arranged on and electronically connected to the top of the top portion, the second electrode arranged at and electrically connected to the bottom of the slot and further arranged on the top of the structural supporting area, the second electrode arranged on the top of the structural supporting area forming an electrode contacting region, which is aligned with the first electrode, the second electrode arranged at the bottom of the slot forming a current injection region, the electrode contacting region and the current injection region have different heights.

2. The light emitting diode structure of claim 1, wherein the epitaxial structure has a thickness of about 2 µm to about 6 µm, a difference between the heights of the electrode contacting region and the current injection region is equal to a depth of each slot, which is about 0.2 µm to about 2 µm.

3. The light emitting diode structure of claim 1, wherein the structural supporting area defines four slots, which divides the structural supporting area into four portions of equal size, an imaginary line connecting each two opposite slots intersects with the center axis of the light emitting diode structure.

4. The light emitting diode structure of claim 1, wherein the structural supporting area is spaced apart from the top portion, thereby forming an annular groove between the structural supporting area and the top portion, an insulating layer is received in the annular groove and surrounds a periphery of the top portion.

5. The light emitting diode structure of claim 1, wherein the epitaxial structure comprises a first semiconductor layer, an active layer, and a second semiconductor layer, the second semiconductor layer is positioned at the bottom portion and extends to the top portion and the structural supporting area, the first semiconductor layer and the active layer are positioned at the top portion and the structural supporting area, the active layer positioned at the top portion is aligned with the active layer positioned at the structural supporting area, the first semiconductor layer positioned at the top portion is aligned with the first semiconductor layer positioned at the structural supporting area, the first electrode is arranged on the top of the first semiconductor layer positioned at the top portion, the second electrode is arranged at the bottom of the slot and on the top of the first semiconductor layer positioned at the structural supporting area.

6. The light emitting diode structure of claim 5, wherein the first electrode is a P-type electrode, the second electrode is an N-type electrode, the first semiconductor layer is a P-GaN layer, the active layer is a multiple quantum wells layer, and the second semiconductor layer is an N-GaN layer.

7. The light emitting diode structure of claim 5, further comprising a supporting portion arranged on a surface of the second semiconductor layer facing away from the active layer.

8. The light emitting diode structure of claim 1, wherein the first electrode and the second electrode are arranged on the epitaxial structure through an electrode film.

9. The light emitting diode structure of claim 1, wherein a solder bump is arranged on a top of the first electrode and on a top of the second electrode.

10. The light emitting diode structure of claim 1, wherein the light emitting diode structure is substantially square, the structural supporting area is positioned at a side of the top portion, the second electrode is further arranged at a periphery of the structural supporting area, the second electrode arranged at the periphery of the structural supporting area is attached to the bottom portion and forms the current injection region.

11. The light emitting diode structure of claim 1, wherein the light emitting diode structure is substantially square, the structural supporting area is positioned at a side of the top portion, the structural supporting area defines a recess, the second electrode further fills in the recess, the second electrode filling in the recess is attached to the bottom portion and forms the current injection region.

* * * * *